(12) United States Patent
Nishio et al.

(10) Patent No.: US 6,707,726 B2
(45) Date of Patent: Mar. 16, 2004

(54) REGISTER WITHOUT RESTRICTION OF NUMBER OF MOUNTED MEMORY DEVICES AND MEMORY MODULE HAVING THE SAME

(75) Inventors: Yoji Nishio, Tokyo (JP); Seiji Funaba, Tokyo (JP); Kayoko Shibata, Tokyo (JP); Toshio Sugano, Tokyo (JP); Hiroaki Ikeda, Tokyo (JP); Takuo Iizuka, Gunma (JP); Masayuki Sorimachi, Gunma (JP)

(73) Assignees: Elpida Memory, Inc., Tokyo (JP); Hitachi, Ltd., Tokyo (JP); Hitachi Tohbu Semiconductor, Ltd., Gunma (JP)

( * ) Notice: Subject to any disclaimer, the term of this patent is extended or adjusted under 35 U.S.C. 154(b) by 0 days.

(21) Appl. No.: 10/206,823

(22) Filed: Jul. 29, 2002

(65) Prior Publication Data

US 2003/0031060 A1 Feb. 13, 2003

(30) Foreign Application Priority Data

Jul. 30, 2001 (JP) ........................................ 2001-229230

(51) Int. Cl.[7] ................................................ G11C 7/00
(52) U.S. Cl. .................. 365/189.12; 365/194; 365/240; 365/205; 365/189.05; 365/230.04
(58) Field of Search ............................ 365/189.12, 194, 365/240, 205, 189.05, 230.04

(56) References Cited

U.S. PATENT DOCUMENTS

| | | | | |
|---|---|---|---|---|
| 6,333,893 B1 | * | 12/2001 | Keeth et al. ................. | 365/233 |
| 6,359,815 B1 | * | 3/2002 | Sato et al. ................... | 365/198 |
| 6,407,963 B1 | * | 6/2002 | Sonoda et al. ........... | 365/233.5 |
| 6,510,087 B2 | * | 1/2003 | Kudou et al. ........... | 365/189.05 |
| 6,556,494 B2 | * | 4/2003 | Morzano et al. ............ | 365/219 |

* cited by examiner

*Primary Examiner*—Van Thu Nguyen
*Assistant Examiner*—Toan Le
(74) *Attorney, Agent, or Firm*—Foley & Lardner

(57) ABSTRACT

First and second pre-processing flip-flops latch a command/address signal inputted to a register by a clock having a frequency of ½ of an external clock signal and an inverse clock thereof. Thus, the command/address signal is decomprossed to a set of signals which temporarily has two times. For example, one of the set of signals has only data contents of an odd-th command/address signal, and the other has only data contents of an even-th command/address signal. Since the set of signals has twice periods of the command/address signal, first and second post-processing flip-flop can latch signals in accordance with an internal clock signal generated by a delay locked loop circuit in a state in which a set-up time and a hold time are sufficiently assured.

26 Claims, 8 Drawing Sheets

REGISTER WITHOUT RESTRICTION OF NUMBER OF MOUNTED MEMORY DEVICES AND MEMORY MODULE HAVING THE SAME

BACKGROUND OF THE INVENTION

The present invention relates to a registered memory module and, more particularly, to a memory module having a delay locked loop (hereinafter, abbreviated to a DLL) circuit in a register.

A technology using stub bustopology for a DQ bus and a clock bus (hereinafter, referred to as related art) has been proposed for purpose of response to a high frequency band. In the related art, an external clock signal WCLK transmitted from a chip set (or memory controller) is distributed into a plurality of memory devices arranged on a substrate of each memory module. Meanwhile, in the related art, a command/address (hereinafter, abbreviated to a C/A) signal transmitted from the chip set to the memory module is latched to a C/A register (hereinafter, referred to as a register) arranged on the substrate of each memory module. Thereafter, the latched C/A signal is distributed to a corresponding memory device as an internal C/A signal.

Currently, a large number of types of memory modules having four to eighteen memory devices, depending on whether or not an ECC function is provided or whether or not which capacity is realized, have come into a market. Operating frequencies of the memory device mounted on one memory module are varied.

On the other hand, in the related art, when the number of mounted memory devices is different if the operating frequency is constant, methods are used whereby loads on the memory modules are forcedly matched and an individual register is utilized every mounted memory device. This is because a set-up time and a hold time are held to be appropriate in a flip-flop forming a latch circuit.

The efficiency of parts is deteriorated when designing and manufacturing another register only because the number of mounted memory devices is different despite the same operating frequency.

In addition, in the related art, as will obviously be understood based on a fact that the change in number of mounted memory devices requires the individual register as mentioned above, it is difficult that the single register responds to a wide operating frequency band.

Under the above-mentioned circumstances, it is desired that a register independent of the number of mounted devices is provided so as to improve the efficiency of parts. Further, it is desired that a register corresponding to a wide frequency band (e.g., a clock frequency of 200 to 300 MHz) is provided.

SUMMARY OF THE INVENTION

Accordingly, it is one object of the present invention to provide a register which can appropriately generate an internal C/A signal independently of the number of mounted memory devices as long as an operating frequency is constant.

It is another object of the present invention to improve the above-mentioned register which can correspond to a wide frequency band.

The present applicants thought as follows. In order to obtain a register which can generate an internal C/A signal independently of the number of mounted memory devices when an operating frequency is constant, the register comprises therein a DLL circuit which controls the delay in accordance with an external clock signal distributed from a chip set and generates an internal clock signal for prescribing latch operation. The latch operation is performed by the above-generated internal clock signal because a deviation (propagation delay) between the external clock signal and the C/A signal in the memory device is absorbed. However, when the synchronous C/A signal deviated from the external clock signal with a half period is latched by the internal clock signal, there is a problem in that a set-up time and a hold time cannot sufficiently be assured in the latch operation.

To solve the above-mentioned problem, the present applicants further thought as follows. The C/A signal may temporarily be latched by the external clock signal and the latched output may be latched again by the internal clock signal.

Next, the present applicants research a method by which the register can correspond to a wide frequency band independently of the number of mounted memory devices. As a research result, in the register, as a pre-processing for latching the C/A signal, a period of the C/A signal is $n^2$ times (e.g., two or four times) and thereafter the resultant signal is latched. Thus, the hold time and the set-up time can sufficiently be assured for the latch operation in the register corresponding to a different operating frequency.

The present invention, in order to solve the above-mentioned problems, based on the foregoing, provides a register for a registered memory module and a memory module having the register.

The register of the present invention is mounted on a memory module including a plurality of memory devices, receives an external clock signal from a chip set outside the memory module and a command/address (hereinafter, abbreviated to a C/A) signal indicated by a plurality of continuous values, and generates an internal C/A signal for the memory device.

According to a first aspect of the present invention, there is provided a register comprising: a delay locked loop (hereinafter, abbreviated to a DLL) circuit receiving an external clock signal, adjusting the amount of delay, and generating an internal clock signal; a first latching unit for latching a C/A signal in accordance with the external clock signal and generating a first intermediate C/A signal; a second latching unit for latching the first intermediate C/A signal in accordance with the internal clock signal and generating a second intermediate C/A signal; and an output unit for outputting the internal C/A signal in accordance with the second intermediate C/A signal.

According to a second aspect of the present invention, there is provided a register comprising: a DLL circuit for receiving an external clock signal, adjusting the amount of delay, and generating an internal clock signal; and a rate converting unit. The rate converting unit receives a C/A signal and generates first and second intermediate C/A signals having a half frequency of the C/A signal. The first intermediate C/A signal has one of odd-th and even-th C/A signals, and the second intermediate C/A signal has the other of the odd-th and even-th C/A signals. The register according to the second aspect further comprises a latching unit for latching the first and second intermediate C/A signals in accordance with the internal clock signal and generating third and fourth intermediate C/A signals, and an output unit for alternately selecting the third and fourth intermediate C/A signals by a half frequency of the internal clock signal and outputting the internal C/A signal.

According to a third aspect of the present invention, there is provided a register comprising: a DLL circuit receiving an external clock signal, adjusting the amount of delay, and generating an internal clock signal; and a rate converting unit. The rate converting unit receives a C/A signal and generates first to n-th intermediate C/A signals having a frequency of $1/n^2$ (where n is a natural number and is not less than 2) of the C/A signal. The first to n-th intermediate C/A signals have values that are sequentially selected at intervals of (n−1) values among from the plurality of continuous values of the C/A signal. The register according to the third aspect of the present invention further comprises a latching unit for latching the first to n-th intermediate C/A signals in accordance with the internal clock signal and generating (n+1)-th to 2n-th intermediate C/A signals, and an output unit for sequentially selecting the (n+1)-th to 2n-th intermediate C/A signals by a frequency of $1/n^2$ of the internal clock signal and outputting the internal C/A signal.

In the present invention, there is provided a memory module comprising a register according to any of the first to third aspects and a plurality of memory devices, all of which are mounted on a single substrate.

Further, in the present invention, there is provided the memory module wherein the number of memory devices is not less than 4 and is not more than 18.

Furthermore, in the present invention, there is provided a memory system comprising the memory module and a chip set.

In addition, in the present invention, there is provided a memory system comprising a register provided for a memory module including a plurality of memory devices, for receiving an external clock signal and a C/A signal indicated by a plurality of continuous values from a chip set outside the memory modules and generating an internal clock signal of the memory device. The register comprises a DLL circuit for receiving the external clock signal, adjusting the amount of delay, and generating an internal clock signal. The necessary number of external clocks from a rising edge of the external clock signal for fetching the C/A signal to the register to a timing for fetching the internal C/A signal corresponding to the C/A signal into the memory device by the external clock signal is at least 2.0.

DESCRIPTION OF THE PREFERRED EMBODIMENTS

A detailed description is given of a register and a registered memory module having the register according to embodiments of the present invention with reference to the drawings.

(First Embodiment)

According to a first embodiment of the present invention, a register can correspond to a memory module having four to eighteen memory devices. Before a detailed statement of the register, first, a description is given of the entire structure of the memory module having the register, a clock generator, a chip set, and the like. Herein, a description is given of the memory module having total eighteen DRAM devices including nine DRAM devices in each side of a mother board (not shown). According to the first embodiment, the memory module is used by being inserted into a socket arranged on the mother board of a computer.

Figure 1:
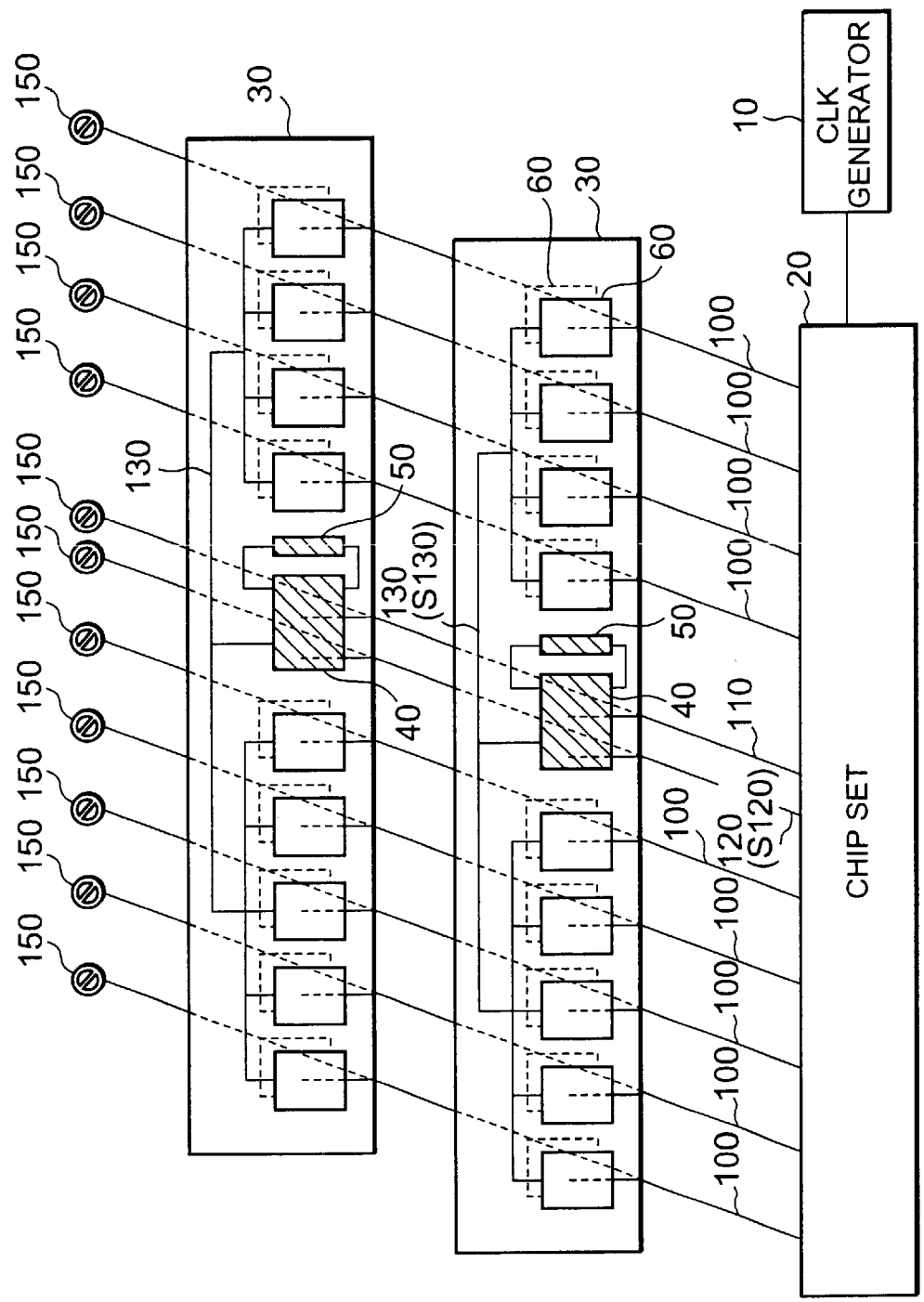
FIG. 1 is a schematic diagram showing an operating environment of a memory module according to a first embodiment of the present invention.

Referring to FIG. 1, a clock generator 10, a chip set 20, and a plurality of memory modules 30 are mounted on the mother board. The clock generator 10 and the chip set 20 form a memory system according to the first embodiment together with the memory modules 30. Each memory module 30 comprises a register 40, a delay replica 50, and a plurality of DRAM devices 60.

The clock generator 10 supplies a basic clock to the chip set 20. The chip set 20 supplies a C/A signal S120 or the like to the register 40 of the memory module 30 in accordance with the basic clock. As will be described later, the register 40 comprises a DLL circuit. The register 40 generates an internal C/A signal (S130) in accordance with the C/A signal (S120) and transmits the generated signal to the DRAM devices 60 while controlling a delay time by using the delay replica 50. The delay replica 50 depends on the number of corresponding mounted memory devices. According to the first embodiment, the number of mounted memory devices corresponding to four to eighteen is set.

According to the first embodiment, more specifically, a DQ bus (not shown) and WCLK buses 100 and 110 have a 92-stub structure. In particular, the WCLK bus 100 for the DRAM device 60 is arranged every DRAM device 60 mounted on one side of the memory module 30. A clock signal supplied to the WCLK bus 100 for the DRAM device 60 is referred as a clock signal WCLKd so as to be distinguished from a clock WCLK supplied to the WCLK bus 110 for the register 40. Then, according to the first embodiment, the WCLK bus 100 propagates a complementary signal consisting of the external clock signal WCLKd for the DRAM device 60 and an inverse signal WCLKd_b of the external clock signal WCLKd. Reference symbol "_b" means inversion and the following referred signals are the same as that. The WCLK bus 110 propagates a complementary signal consisting of the external clock signal WCLK and an inverse signal WCLK_b of the external clock signal WCLK. A bus (external C/A bus) 120 for the C/A signal transmitted to the memory module 30 from the chip set 20 has approximately 25-stub structure. The buses having the above stub structures are terminated by a terminating resistor 150. A bus (internal C/A bus) 130 for the internal C/A signal transmitted to each DRAM device 60 from the register 40 uses a two-stepped bus structure (hereinafter, referred to as a dual T-branch structure).

Figure 2:
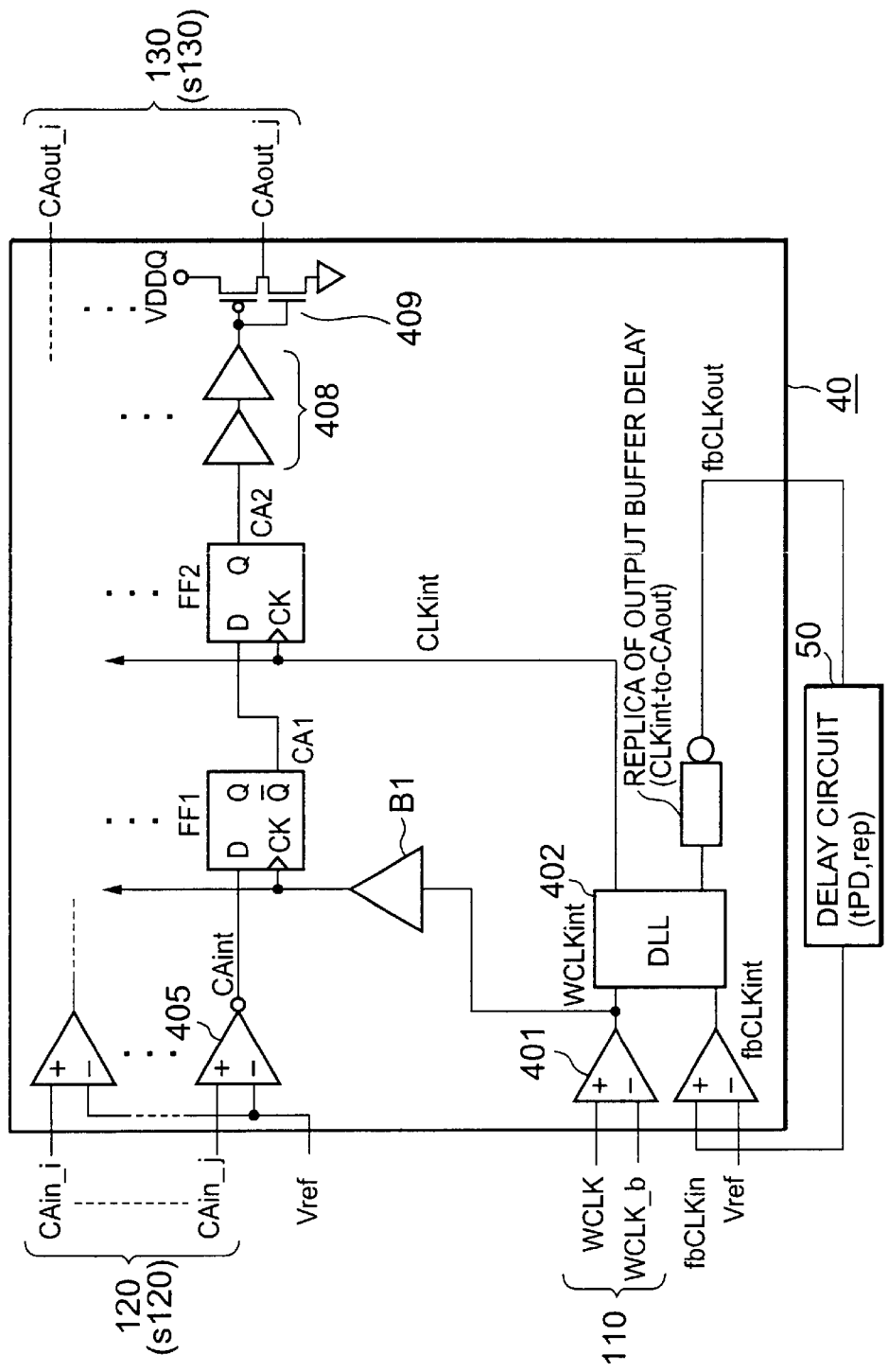
FIG. 2 is a diagram showing the schematic structure of a register according to the first embodiment of the present invention.
Figure 3:
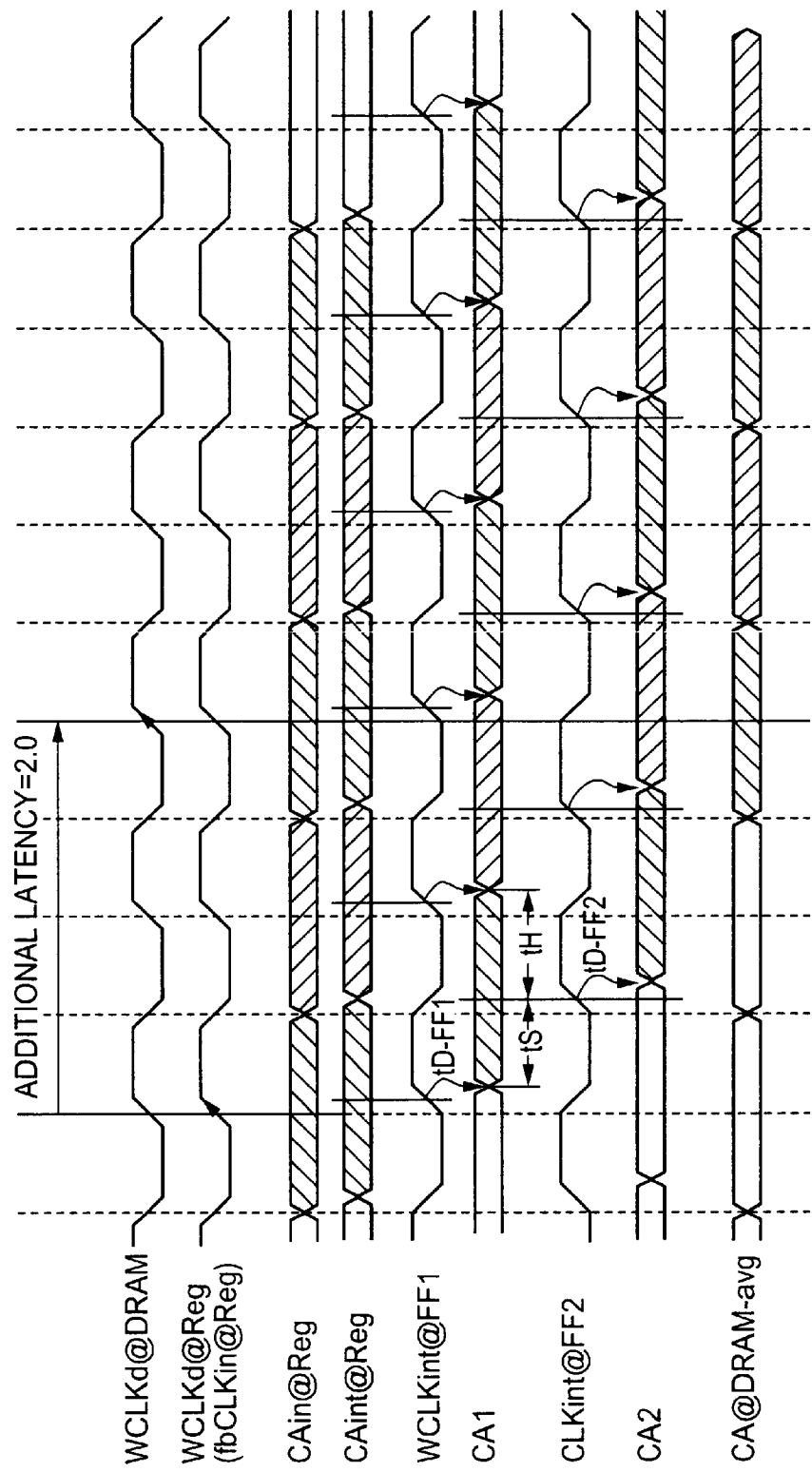
FIG. 3 is a timing diagram for explaining the operation of the register shown in FIG. 2.

Referring to FIG. 2, the register 40 comprises an input circuit 401 for clock and a DLL circuit 402. The input circuit 401 for clock inputs the external clock signal WCLK and the inverse signal WCLK_b thereof, and generates a WCLKint signal. That is, the WCLKint signal is generated by using a cross point between the external clock signal WCLK and the inverse signal WCLK_b thereof, and is a signal which is adjusted so that the influence of the change in voltage is suppressed. The DLL circuit 402 receives the WCLKint signal, controls the delay by using a replica of output buffer delay and the delay replica (propagation delay) 50, and generates an internal clock signal CLKint (refer to CLKint@FF2 in FIG. 3). Then, FIG. 3 shows a timing diagram when the frequency of the external clock signal WCLK is 300 MHz and an additional latency is 2.0.

The C/A signals propagated via the external C/A bus 120 (CAin_i to CAin_j, etc.) are subjected to internal C/A signal generation processing every signal according to the first embodiment. In the following, one C/A signal CAin_j is described as an example. Referring to FIG. 2, for the sake of convenience, only the structure for processing the C/A signal CAin_j is shown among the plurality of C/A signals CAin_i to CAin_j and, however, the structure for other C/A signals are the same as that mentioned above.

The C/A signal CAin_j reaches the register 40. Then, the inputted C/A signal CAin_j is compared with a reference voltage Vref by an input circuit 405 for CA signal, and is converted into the C/A signal CAint which is obtained by suppressing the influence of the change in voltage (refer to CAint@Reg in FIG. 3). The C/A signal CAint is inputted to a data input terminal of a pre-processing flip-flop FF1.

The pre-processing flip-flop FF1 is a positive-edge-trigger-type flip-flop. The WCLKint signal that is the adjusted external clock signal is inputted to a clock input terminal CK of the pre-processing flip-flop FF1 via a buffer B1. The pre-processing flip-flop FF1 latches the C/A signal CAint inputted to the data input terminal D at a positive edge (rising edge corresponding to a timing tD-FF1 in FIG. 3) of the adjusted external clock signal WCLKint inputted to the clock input terminal CK. The pre-processing flip-flop FF1 continuously outputs inverse data of the latched data (value of the C/A signal CAint) from a data inverse output terminal Q_b until the next positive edge (refer to CA1 in FIGS. 2 and 3). Incidentally, for the sake of a brief description, referring to FIG. 3, the output is designated by a true signal. According to the first embodiment, an output of the pre-processing flip-flop FF1 is referred to as a first intermediate C/A signal CA1. The first intermediate C/A signal CA1 is inputted to a data input terminal D of a post-processing flip-flop FF2.

The post-processing flip-flop FF2 is also a positive-edge-trigger-type flip-flop. The internal clock signal CLKint is inputted to a clock input terminal CK of the post-processing flip-flop FF2. The internal clock signal CLKint is a clock signal obtained by front-loading the external clock signal WCLK (WCLK@Reg in FIG. 3) inputted to the register 40 by the delay time of the output buffer and the propagation delay time of the C/A signal on the memory module. The delay time of the output buffer means a delay time from the internal clock signal CLKint to an internal C/A signal CAout. The propagation delay time of the C/A signal on the memory module means a reach time of the internal C/A signal CAout to the DRAM device 60.

The post-processing flip-flop FF2 latches the first intermediate C/A signal CA1 inputted to the data input terminal D at a positive edge (at a timing tD-FF2 in FIG. 3) of the internal clock signal CLKint inputted to the clock input terminal CK. The post-processing flip-flop FF2 continuously outputs the latched data (value of the first intermediate C/A signal CA1) from a data output terminal Q until at least the next positive edge (refer to CA2 in FIGS. 2 and 3). Incidentally, for the sake of a brief description, referring to FIG. 3, the output is designated by a true signal. According to the first embodiment, an output of the post-processing flip-flop FF2 is referred to as a second intermediate C/A signal CA2. The second intermediate C/A signal CA2 is transmitted via a drive (output unit of the register 40) comprising a pre-drive 408 and an output inverter 409 and is supplied to the DRAM device 60 via an internal C/A bus 130 as an internal C/A signal CAout_j (CA@DRAM-avg in FIG. 3). The remaining C/A signals are similarly processed.

According to the first embodiment, referring to FIG. 3, as will be understood, a set-up time (tS) and a hold time (tH) are sufficiently ensured in the register 40. As mentioned above, it is understood that the register according to the first embodiment is advantageous for the purpose of only one operating frequency. Further, the set-up time (tS) and the hold time (tH) are also sufficiently assured to the DRAM device 60. According to the first embodiment, the necessary number of clocks from a rising edge of the external clock signal WCLK for fetching the C/A signal to the register 40 to a using timing of the C/A signal in the DRAM device 60 (namely, additional latency) is suppressed to 2.0 (refer to WCLK@Reg and CA@DRAM-avg).

For example, according to the first embodiment, the delay FF (D-FF) as the flip-flop is shown as an example. However, if a connection relationship of the delay FF is changed as follows, the operation is the same as that mentioned above. That is, the data output terminal Q of the pre-processing flip-flop FF1 is connected to the data input terminal D of the post-processing flip-flop FF2. In this case, the post-processing flip-flop FF2 latches an inverse signal of the above-mentioned first intermediate C/A signal CA1. Therefore, a signal outputted from the data output terminal Q of the post-processing flip-flop FF2 also becomes an inverse signal of the above-mentioned second intermediate C/A signal CA2. In place thereof, a signal outputted from the data inverse output terminal Q_b of the post-processing flip-flop FF2 becomes the same signal as the second intermediate C/A signal CA2. Thus, the signal outputted from the data inverse output terminal Q_b is inputted to the pre-drive 408. The above-mentioned change of the connection relationship essentially does not change the operation according to the first embodiment of the present invention, and it is included in the concept of the present invention. Another flip-flop may be used in place of the delay FF according to the first embodiment without departing the concept of the present invention.

(Second Embodiment)

A register according to a second embodiment of the present invention is obtained by improving the register according to the first embodiment corresponding to a predetermined operating frequency band. According to the second embodiment, the register can correspond to an operating frequency band of 200 to 300 MHz. The structure of the register according to the second embodiment is shown in FIG. 4.

Figure 4:
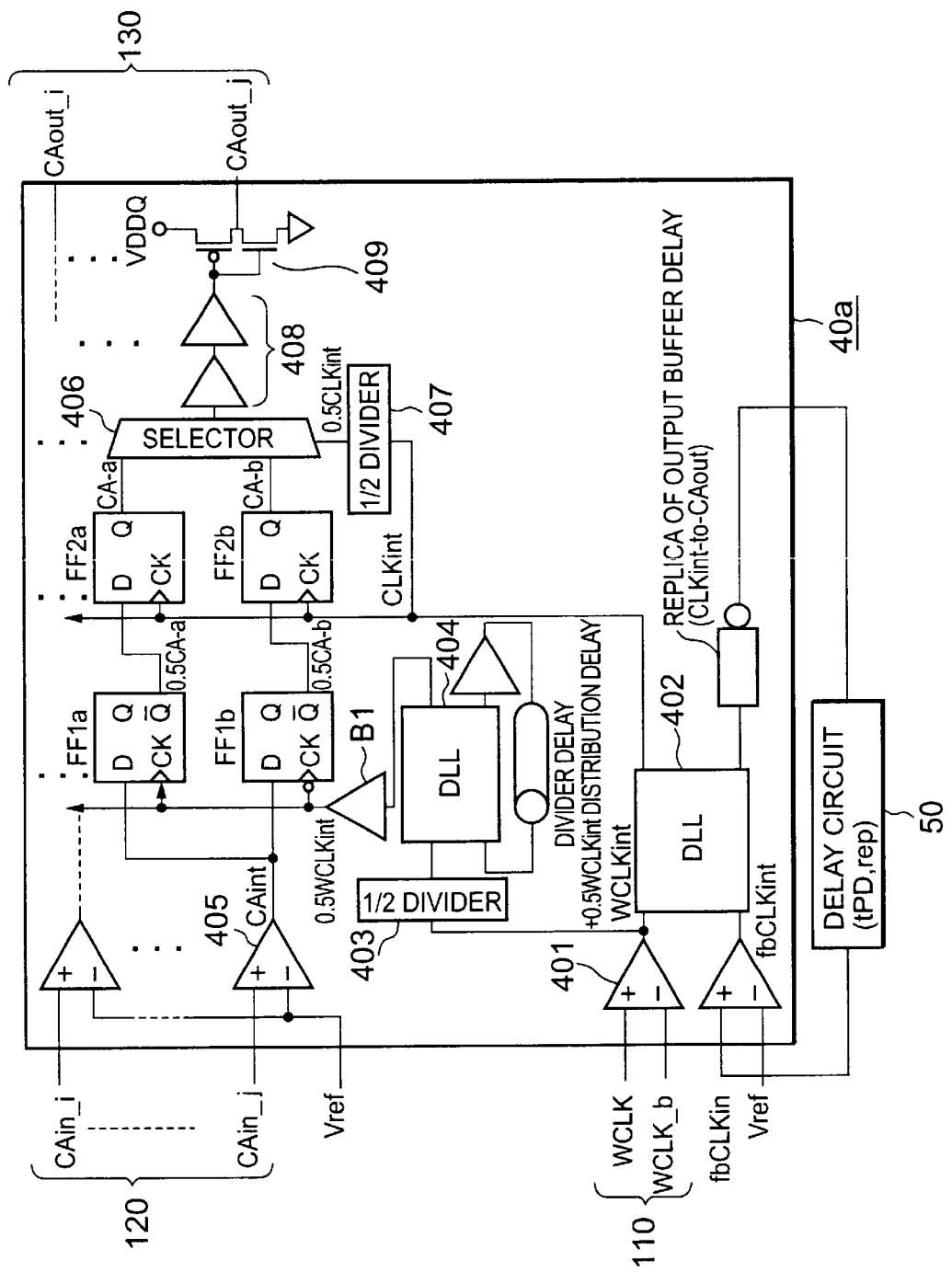
FIG. 4 is a diagram showing the schematic structure of a register according to a second embodiment of the present invention.
Figure 5:
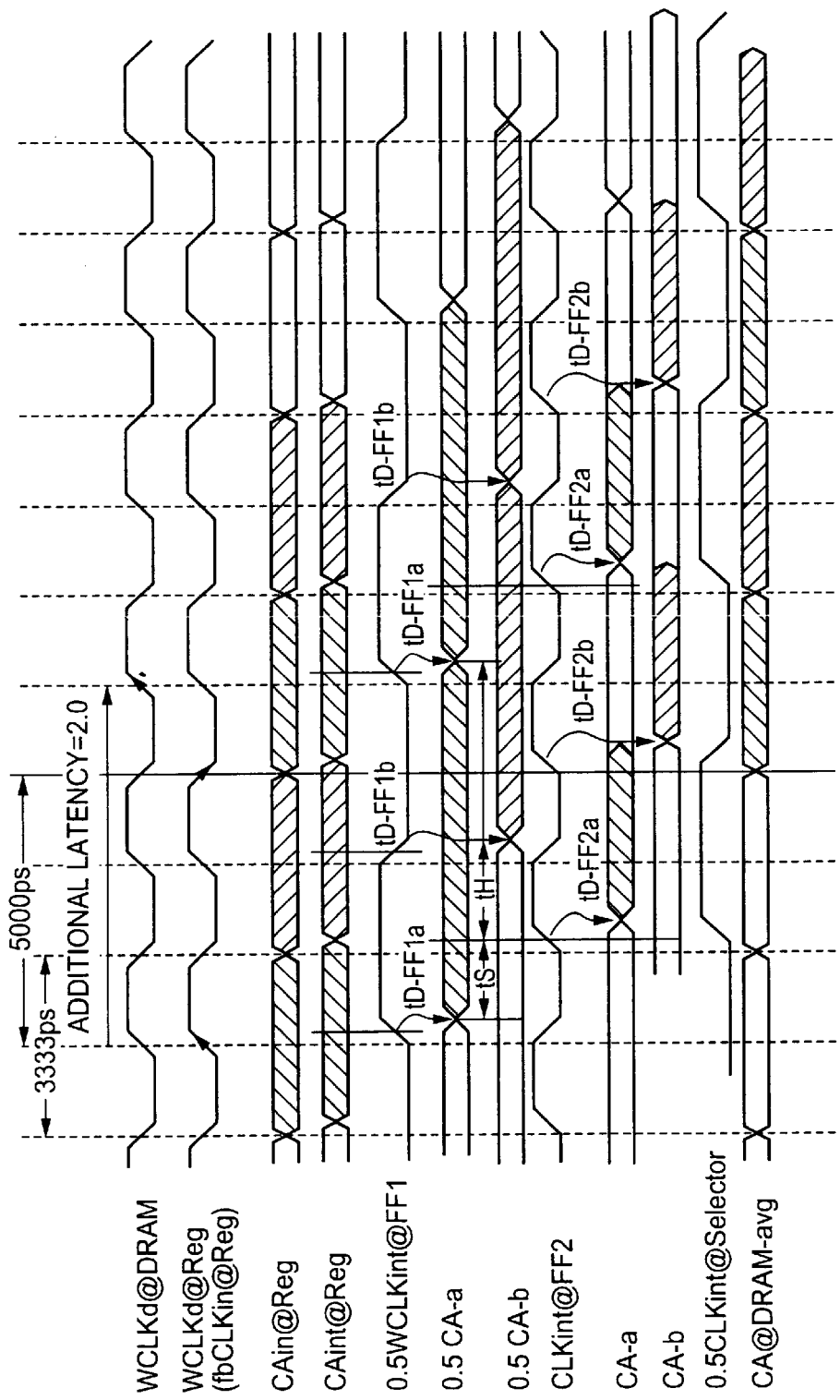
FIG. 5 is a timing diagram for explaining the operation of the register shown in FIG. 4.

Referring to FIG. 4, a register 40a comprises the input circuit 401 for clock and the DLL circuit 402, similarly to the register 40 according to the first embodiment. The input circuit 401 for clock inputs an external clock signal WCLK and an inverse signal WCLK_b of the external clock signal WCLK, and generates a WCLKint signal. The DLL circuit 402 receives the WCLKint signal, controls the delay by using a replica of output buffer delay and a delay replica (propagation delay) 50, and generates an internal clock signal CLKint (refer to CLKint@FF2 in FIG. 5). FIG. 5 shows a timing diagram when the frequency of the external clock signal WCLK is 300 MHz and an additional latency is 2.0.

According to the second embodiment, a WCLKint signal that is an adjusted external clock signal is also inputted to a ½ divider 403. The ½ divider 403 generates a first temporary external clock signal having a half frequency of the external clock. An additional DLL circuit 404 is connected to a post stage of the ½ divider 403. The first temporary external clock signal is subjected to delay control by the additional DLL circuit 404 in terms of the delay in the ½ divider 403, and outputs a second temporary external clock signal (0.5 WCLKint signal) via a buffer B1 (refer to 0.5 WCLKint@FF1 in FIG. 5).

The C/A signals propagated via the external C/A bus 120 (CAin_i to CAin_j, etc.) are subjected to internal C/A signal generation processing every signal according to the second embodiment. In the following, one C/A signal CAin_j is described as an example. Referring to FIG. 4, for the sake of convenience, only the structure for processing the C/A signal CAin_j is shown among from the plurality of C/A signals to CAin_j and, however, the structures for processing other C/A signals are the same as that mentioned above.

The C/A signal CAin_j reaches the register 40a. Then, the inputted C/A signal CAin_j is compared with a reference voltage Vref by an input circuit 405 for CA signal, and is converted into the C/A signal CAint which is obtained by suppressing the influence of the change in voltage (refer to CAint@Reg in FIG. 5). The C/A signal CAint is inputted to data input terminals D of a first pre-processing flip-flop FF1a and a second pre-processing flip-flop FF1b.

The first and second pre-processing flip-flops FF1a and FF1b are positive-edge-trigger-type flip-flops. A second temporary external clock signal (0.5 WCLKint) is inputted to a clock input terminal CK of the first pre-processing flip-flop FF1a, and an inverse signal of the second temporary external clock signal (0.5 WCLKint) is inputted to a clock input terminal CK of the second pre-processing flip-flop FF1b. The first pre-processing flip-flop FF1a latches the C/A signal CAint inputted to the data input terminal D at a positive edge (rising edge corresponding to a timing tD-FF1a in FIG. 5) of the second temporary external clock signal inputted to the clock input terminal CK. The first pre-processing flip-flop FF1a continuously outputs inverse data of the latched data (value of the C/A signal CAint) from a data inverse output terminal Q_b until the next positive edge (refer to 0.5 CA-a in FIGS. 4 and 5). Incidentally, for the sake of a brief description, referring to FIG. 4, the output is designated by a true signal. Further, according to the second embodiment, the second pre-processing flip-flop FF1b latches the C/A signal CAint inputted to the data input terminal D at a positive edge (at a timing tD-FF1b in FIG. 5) of the inverse signal of the second temporary external clock signal (0.5 WCLKint). The second pre-processing flip-flop FF1b continuously outputs inverse data of the latched data (value of the C/A signal CAint) from a data inverse output terminal Q_b until the next positive edge (refer to 0.5 CA-b in FIGS. 4 and 5). Incidentally, for the sake of a brief description, referring to FIG. 5, the output is designated by a true signal. Thus, the first and second pre-processing flip-flops FF1a and FF1b perform latch operation by delay of a ½ period of the second temporary external clock signal (0.5 WCLKint) (that is, one period of the external clock signal WCLK). In other words, the first and second pre-processing flip-flops FF1a and FF1b latch only a value of an even-th or odd-th C/A signal CAint. For example, when the first pre-processing flip-flop FF1a latches and outputs only the value of the odd-th C/A signal CAint, the second pre-processing flip-flop FF1b latches and outputs only the value of the even-th C/A signal CAint. A phase of the output of the first pre-processing flip-flop FF1a is deviated from a phase of the output of the second pre-processing flip-flop FF1b by a half period of the second temporary external clock signal (0.5 WCLKint).

According to the second embodiment, the output of the first pre-processing flip-flop FF1a is referred to as a first intermediate C/A signal (0.5 CA-a), and the output of the second pre-processing flip-flop FF1b is referred to as a second intermediate C/A signal (0.5 CA-b). The first intermediate C/A signal (0.5 CA-a) and the second intermediate C/A signal (0.5 CA-b) are inputted to the data input terminals D of first and second post-processing flip-flops FF2a and FF2b.

The first and second post-processing flip-flops FF2a and FF2b are positive-edge-trigger-type flip-flops. The internal clock signal CLKint is inputted to the first and second post-processing flip-flops FF2a and FF2b.

The first post-processing flip-flop FF2a latches the first intermediate C/A signal (0.5 CA-a) inputted to the data input terminal D at a positive edge (at a timing tD-FF2a in FIG. 5) of the internal clock signal CLKint inputted to the clock input terminal CK. The first post-processing flip-flop FF2a continuously outputs the latched data (value of the first intermediate C/A signal (0.5 C/A-a)) from the data output terminal Q until at least the next positive edge (refer to CA-a in FIGS. 4 and 5). Incidentally, for the sake of a brief description, referring to FIG. 5, the output is designated by a true signal. Further, according to the second embodiment, the second post-processing flip-flop FF2b latches the second intermediate C/A signal (0.5 CA-b) inputted to the data input terminal D at a positive edge (at a timing tD-FF2b in FIG. 3) of the internal clock signal CLKint. The second post-processing flip-flop FF2b continuously outputs the latched data (value of the second intermediate C/A signal (0.5 CA-b)) from the data output terminal Q until at least the next positive edge (refer to CA-b in FIGS. 4 and 5). Incidentally, for the sake of a brief description, referring to FIG. 5, the output is designated by a true signal. According to the second embodiment, an output of the first post-processing flip-flop FF2a is referred to as a third intermediate C/A signal CA-a, and an output of the second post-processing flip-flop FF2b is referred to as a fourth intermediate C/A signal CA-b. The third and fourth intermediate C/A signals CA-a and CA-b alternately held at least a signal value of an odd-th or even-th C/A signal CAint at a period of the external clock signal WCLK. For example, when m is a natural number, if the third intermediate C/A signal CA-a indicates a signal value of an (m−1)-th C/A signal CAint, the fourth intermediate C/A signal CA-b denotes a signal value of an m-th C/A signal CAint during a period of a next external clock signal WCLK. Further, during a period of a next external clock signal WCLK, the third intermediate C/A signal C/A-a indicates a signal value of an (m+1)-th C/A signal CAint. Incidentally, for a period before that indicating the signal value of the (m+1)-th C/A signal CAint as a next period of that indicating the signal value of the (m−1)-th C/A signal CAint, the third intermediate C/A signal CA-a indicates any of the (m−1)-th or (m+1)-th C/A signal CAint. Further, for a period before that indicating the signal value of an (m+2)-th C/A signal CAint as a next period of that indicating the signal value of the m-th C/A signal CAint, the fourth intermediate C/A signal CA-b indicates any of the m-th or (m+2)-th C/A signal CAint. The above-mentioned third and fourth intermediate C/A signals CA-a and CA-b are inputted to a selector 406.

The selector 406 selects signals in accordance with an output of an additional ½ divider 407. More specifically, the additional ½ divider 407 divides the internal clock signal CLKint generated by the DLL circuit 402 to half, and generates an temporary internal clock signal (0.5 CLKint) having twice periods of the internal clock signal (CLKint) (refer to 0.5 CLKint@Selector in FIG. 3). The selector 406 alternately selects the inputted third and fourth intermediate C/A signals CA-a and CA-b in accordance with the temporary internal clock signal (0.5 CLKint), and outputs the selected C/A signal. The selected C/A signal has the same contents as those of the C/A signal CAint. The selected C/A signal is transmitted via a drive (namely, an output unit of the register 40a) comprising a pre-drive 408 and an output inverter 409, and is supplied to the DRAM device 60 via an internal C/A bus 130 as an internal C/A signal CAout_j (corresponding to CA@DRAM-avg in FIG. 5). The remaining C/A signals are similarly processed.

According to the second embodiment, referring to FIG. 5, it is understood that the set-up time (tS) and the hold time (tH) are sufficiently ensured in the register 40a. Further, the set-up time (tS) and the hold time (tH) are sufficiently ensured in the DRAM device 60. FIG. 5 is a timing diagram when the frequency of the external clock signal WCLK is 300 MHz (period is 3333 ps). It is understood that based on the operation, the set-up time (tS) and the hold time (tH) are also sufficiently ensured when the frequency of the external clock signal WCLK is 200 MHz (period is 5000 ps). According to the second embodiment, the necessary number of clocks from the rising edge of the external clock signal WCLK for fetching the C/A signal to the register 40a to a using timing of the C/A signal in the DRAM device 60 (namely, additional latency) is suppressed to 2.0 (refer to WCLK@Reg and CA@DRAM-avg in FIG. 5).

(Third Embodiment)

Figure 6:
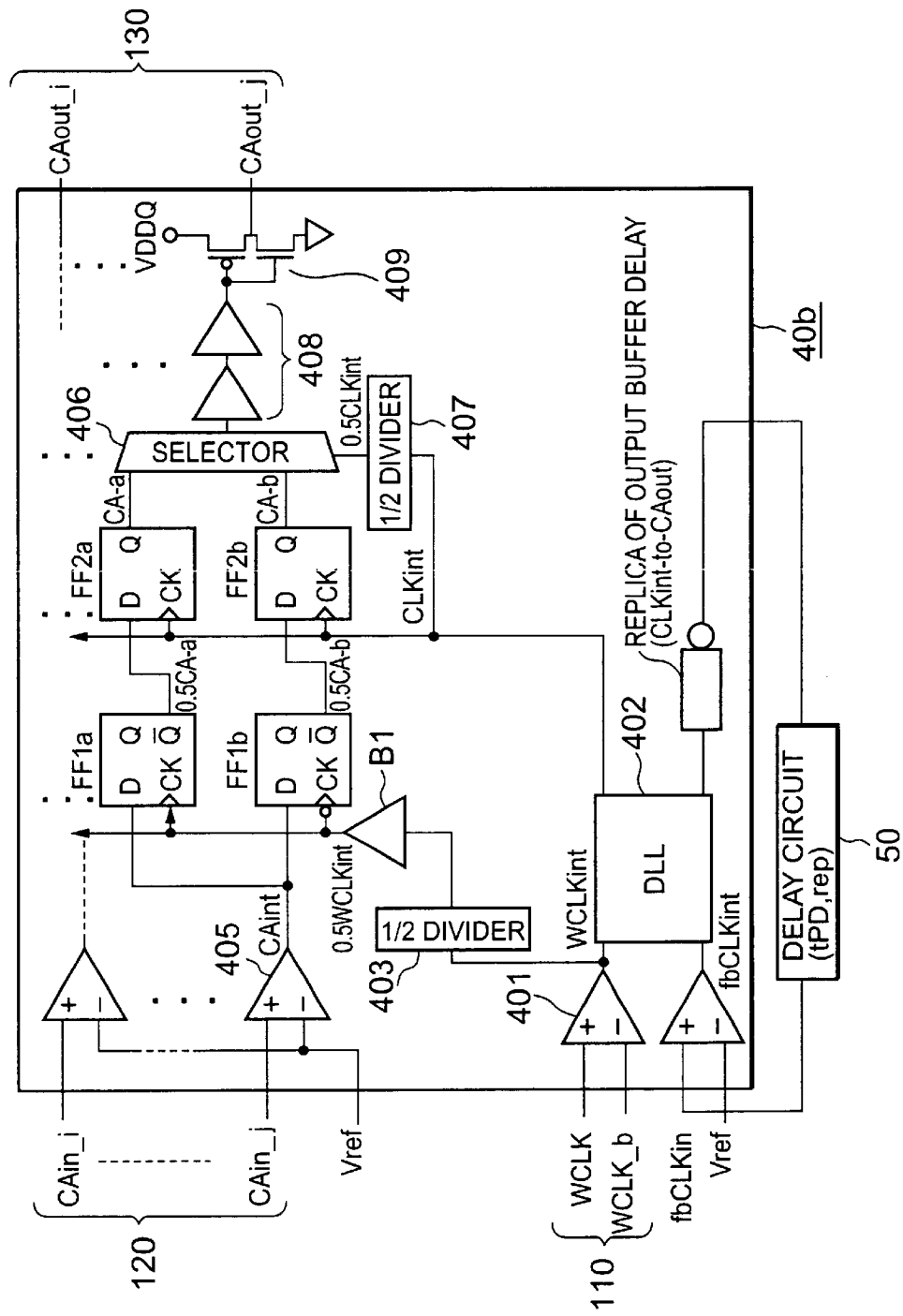
FIG. 6 is a diagram showing the schematic structure of a register according to a third embodiment of the present invention.

A register according to a third embodiment of the present invention is structured according to a modification of the second embodiment. The structure of the register according to the third embodiment is shown in FIG. 6. Referring to FIGS. 4 and 6, as will clearly be understood, a register 40b according to the third embodiment has the same structure of the register 40a according to the second embodiment, except for the replica comprising the additional DLL circuit 404 and the loop thereof. FIG. 6 shows only the structure for processing the C/A signal CAin_j among a plurality of C/A signals CAin_i to CAin_j for the sake of convenience. Structures for processing other C/A signals are the same as the foregoing.

According to the third embodiment, a temporary external clock signal (0.5 WCLKint) outputted from the ½ divider 403 is inputted to the first pre-processing flip-flop FF1a, and the inverse signal of the temporary external clock signal (0.5 WCLKint) is inputted to the second pre-processing flip-flop FF1b. Thus, the latch operation of the first and second pre-processing flip-flops FF1a and FF1b is deviated from that according to the second embodiment by a delay time of the ½ divider 403. However, when the operating frequency band is set to at least 200 to 300 MHz, the delay time of the ½ divider 403 exists an allowable range. Therefore, according to the third embodiment, the set-up time (tS) and the hold time (tH) are sufficiently assured.

According to the second and third embodiments, the delay FF (DFF) as the flip-flop is shown as an example. However, as noted in the first embodiment, if a connection relationship of the delay FF is changed as follows, the operation is the same as that mentioned above. That is, the data output terminals Q of the first and second pre-processing flip-flops FF1a and FF1b are connected to the data input terminals D of the first and second post-processing flip-flops FF2a and FF2b. In this case, the first and second post-processing flip-flops FF2a and FF2b latch the inverse signals of the first and second intermediate C/A signals (0.5 CA-a and 0.5 CA-b), respectively. Therefore, output signals of the data output terminals Q of the first and second post-processing flip-flops FF2a and FF2b are inverse signals of the third and fourth intermediate C/A signals CA-a and CA-b. In place thereof, output signals of the data inverse output terminals Q_b of the first and second post-processing flip-flops FF2a and FF2b become the same signal as the third and fourth intermediate C/A signal CA-a and CA-b and, therefore, they are inputted to the selector 406. The above-mentioned change of the connection relationship essentially does not change the operation according to the third embodiment of the present invention, and is included in the concept of the present invention. Another flip-flop can be used in place of the delay FF according to the second and third embodiments without departing the concept of the present invention.

(Fourth Embodiment)

Figure 7:
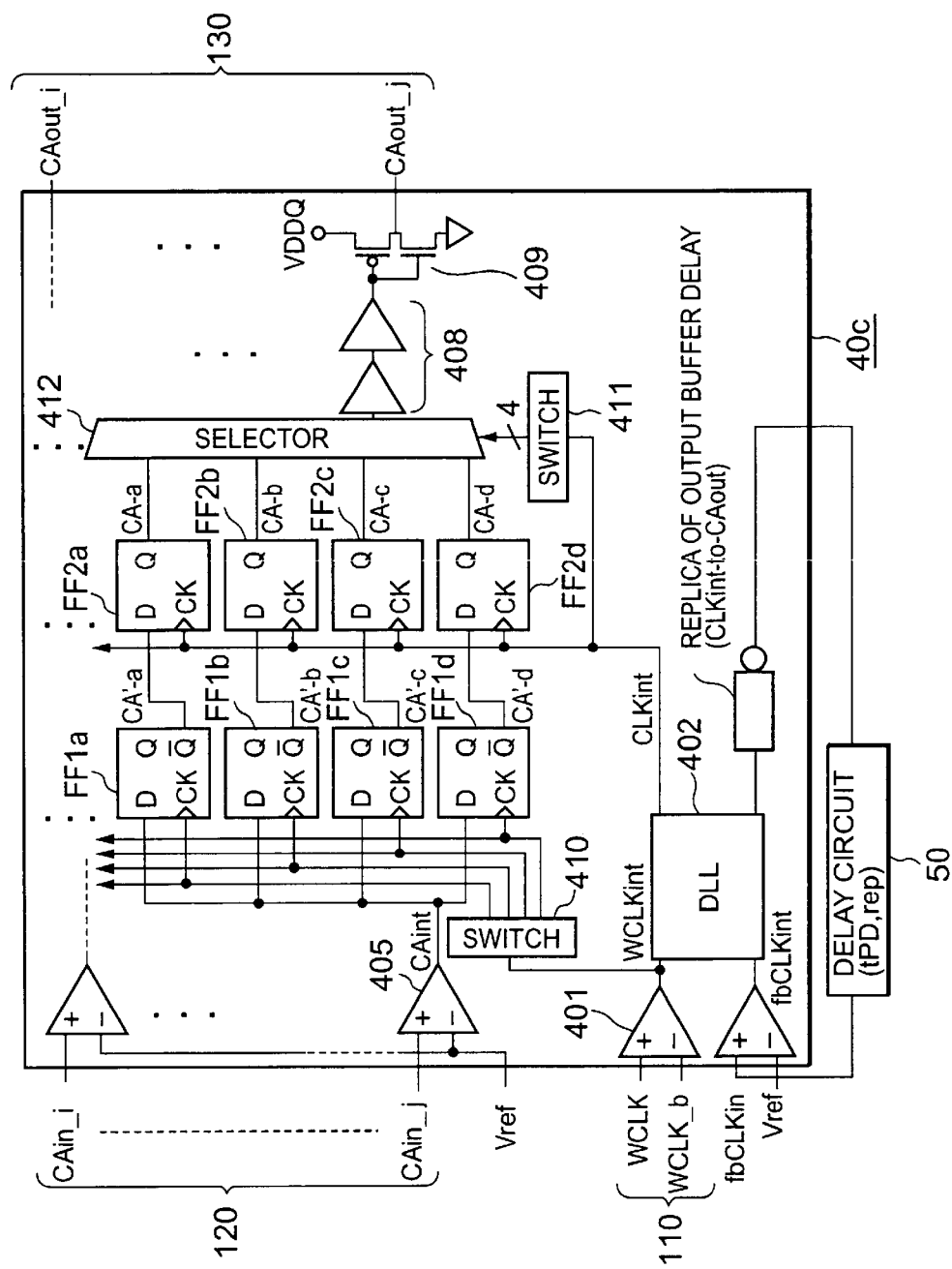
FIG. 7 is a diagram showing the schematic structure of a register according to a fourth embodiment of the present invention.

A register according to a fourth embodiment of the present invention is structured according to a modification of the third embodiment. According to the fourth embodiment, the register has a data rate conversion of four times of the inputted C/A signal, instead of two times. The structure of the register according to the fourth embodiment is shown in FIG. 7. Referring to FIG. 7, for the sake of convenience, only the structure of processing the C/A signal CAint_j is shown among a plurality of C/A signals CAin_i to CAin_j. However, structures for processing other C/A signals are the same as the foregoing. According to the fourth embodiment, the register can correspond to an operating frequency band of 500 to 600 MHz.

Figure 8:
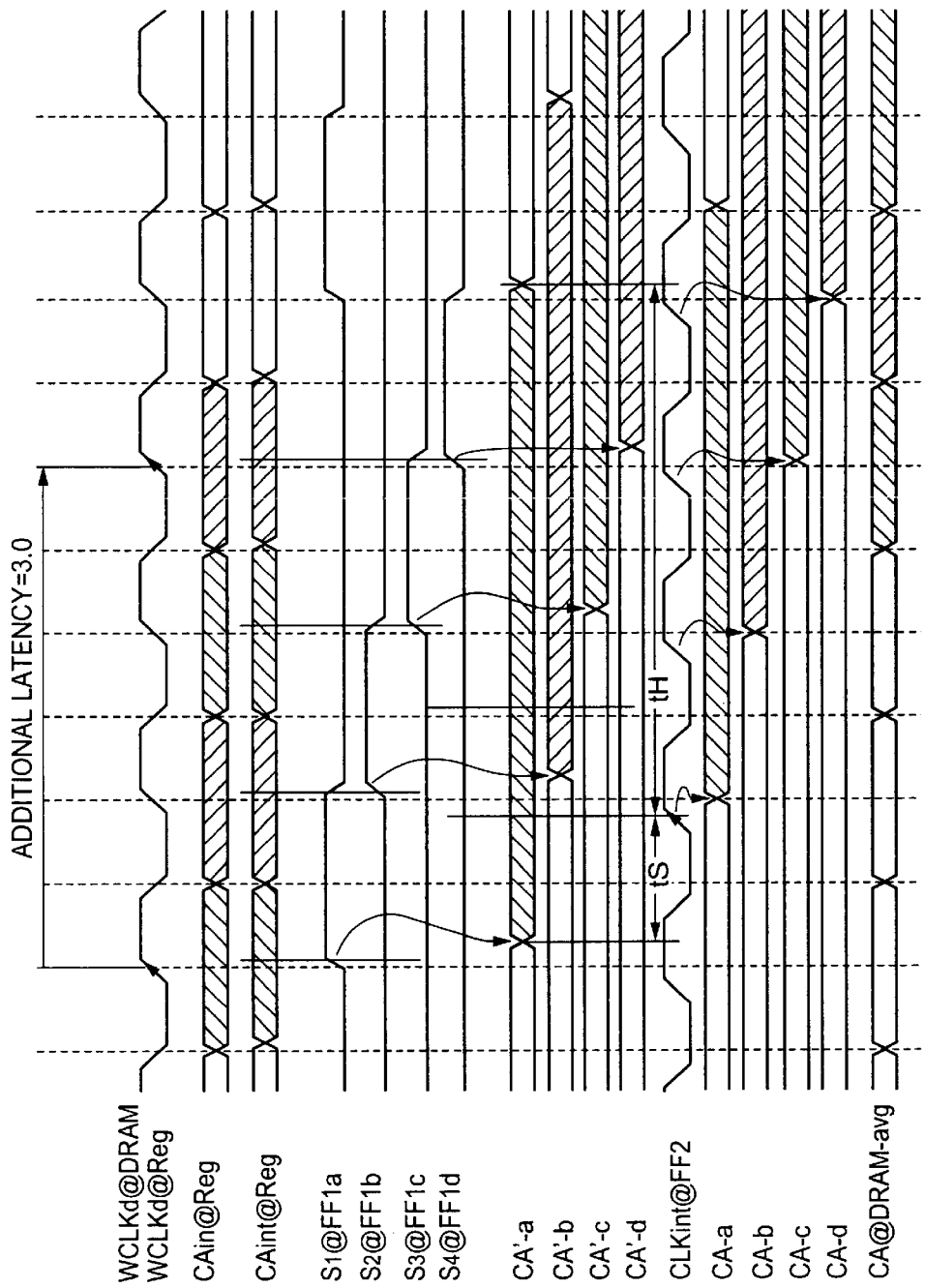
FIG. 8 is a timing diagram for explaining the operation of the register shown in FIG. 7.

Referring to FIG. 7, a register 40c comprises the input circuit 401 for clock and the DLL circuit 402, similarly to the registers 40, 40a, and 40b according to the first to third embodiments. The operations of the input circuit 401 for clock and the DLL circuit 402 are mentioned above and, therefore, a description thereof is omitted. FIG. 8 shows a timing diagram when the frequency of the external clock signal WCLK is 500 MHz and an additional latency is 3.0.

According to the fourth embodiment, the signal WCLKint that is an adjusted external clock signal is also inputted to a switch 410. The switch 410 generates based on the signal WCLKint, first to fourth switch signals S1 to S4 whose period is four times of the signal WCLKint and whose duty ratio is 1/4. The first to fourth switch signals S1 to S4 are obtained by deviating phases of the signal WCLKint by one period. The first to fourth switch signals S1 to S4 are supplied to the clock input terminals CK of first to fourth pre-processing flip-flops FF1a to FF1d (refer to S1 to S4 in FIG. 8). According to the fourth embodiment, the first to fourth switch signals S1 to S4 are directly inputted to the clock input terminals CK of the first to fourth pre-processing flip-flops FF1a to FF1d. However, by applying the above-mentioned concept of the second embodiment, the additional DLL circuit for compensating a delay time of the switch 410 may be arranged between the switch 410 and the first to fourth pre-processing flip-flops FF1a to FF1d. The structure of the interposition of the additional DLL circuit can be applied to the register according to the first embodiment (refer to FIG. 2).

The C/A signals CAin_i to CAin_j propagated through the external C/A bus 120 are subjected to internal C/A signal generation processing every C/A signal according to the fourth embodiment. In the following, one C/A signal CAin_j is described as an example.

When the C/A signal CAin_j reaches the register 40c, it is compared with the reference voltage Vref by the input circuit 405 for CA signal, and is converted into the C/A signal CAint which is obtained by suppressing the influence of the change in voltage (refer to CAint@Reg in FIG. 8). The C/A signal CAint is inputted to the data input terminals D of the first to fourth pre-processing flip-flops FF1a to FF1d.

The first to fourth pre-processing flip-flops FF1a to FF1d are positive-edge-trigger-type flip-flops. The first to fourth pre-processing flip-flops FF1a to FF1d latch data inputted to the clock input terminals CK at rising timings of the first to fourth switch signals S1 to S4 (refer to S1@FF1a to S4@FF1d in FIG. 8).

As mentioned above, the first to fourth switch signals S1 to S4 have the duty ratio of 1/4 and are the signals whose phases are deviated by one period of the signal WCLKint. Therefore, the first to fourth pre-processing flip-flops FF1a to FF1d sequentially latch the values of the C/A signals which are continuously sent, every period of the signal WCLKint. The next positive edge of the signal is inputted after four periods of the signal WCLKint. Thus, the first to fourth pre-processing flip-flops FF1a to FF1d continuously output inverse data of the latched data (values of the C/A signal CAint) until the next positive edge (after four periods converted by the period of the signal WCLKint) from the data inverse output terminals Q_b (refer to CA'-a, CA'-b, CA'-c, and CA'-d in FIGS. 7 and 8). Incidentally, for the sake of a brief description, referring to FIG. 8, the output is designated by a true signal. According to the fourth embodiment, outputs of the first to fourth pre-processing flip-flops FF1a to FF1d are referred to as first to fourth intermediate C/A signals CA'-a, CA'-b, CA'-c, and CA'-d, respectively. The first to fourth intermediate C/A signals CA'-a, CA'-b, CA'-c, and CA'-d are inputted to data input terminals D of first to fourth post-processing flip-flops FF2a to FF2d.

The first to fourth post-processing flip-flops FF2a to FF2d are also positive-edge-trigger-type flip-flops. The internal clock signals CLKint are inputted to clock input terminals CK of the first to fourth post-processing flip-flops FF2a to FF2d.

The first to fourth post-processing flip-flops FF2a to FF2d latch the first to fourth intermediate C/A signals CA'-a, CA'-b, CA'-c, and CA'-d inputted to the clock input terminals CK at positive edges of the internal clock signals CLKint inputted to the clock input terminal CK. The first to fourth post-processing flip-flops FF2a to FF2d continuously output the latched data (values of first to fourth intermediate C/A signals CA'-a, CA'-b, CA'-c, and CA'-d) from the data output terminals Q until at least the next positive edges (refer to CLKint@FF2 and CA'-a, CA'-b, CA'-c, and CA'-d in FIGS. 7 and 8). Incidentally, for the sake of a brief description, the output is designated by a true signal in FIG. 8. According to the fourth embodiment, outputs of the first to fourth post-processing flip-flops FF2a to FF2d are referred to as fifth to eighth intermediate C/A signals CA-a, CA-b, CA-c, and CA-d. Herein, k is a natural number. The fifth to eighth intermediate C/A signal CA-a, CA-b, CA-c, and CA-d hold signal values of at least k-th, (k+1)-th, (k+2)-th, and (k+3)-th C/A signals CAint which are deviated by one period of the external clock signals WCLK for a period of four times of the external clock signal WCLK. The fifth to eighth intermediate C/A signals CA-a, CA-b, CA-c, and CA-d are inputted to a selector 412.

The selector 412 selects signals in accordance with outputs of a switch 411. The switch 411 has the same structure as that of the switch 410. The switch 411 generates fifth to eighth switch signals having a period of four times of the internal clock signal CLKint and a duty ratio of 1/4. The fifth to eighth switch signals have phases which are sequentially deviated by one period of the internal clock signal CLKint. The selector 412 sequentially selects the inputted fifth to eighth intermediate C/A signals CA-a, CA-b, CA-c, and CA-d in accordance with the fifth to eighth switch signals and outputs the selected C/A signals. The selected C/A signals have the same signal contents of those of the C/A signal CAint. The selected C/A signal is sent via a drive comprising the pre-drive 408 and the output inverter 409 (namely, an output unit of the register 40c), and is supplied as the internal C/A signal CAout_j to the DRAM device 60 via the internal C/A bus 130 (CA@DRAM-avg in FIG. 8). The remaining C/A signals are similarly processed.

Referring to FIG. 8, according to the fourth embodiment, it is understood that the set-up time (tS) and the hold time (tH) are sufficiently ensured in the register 40c. Further, the set-up time (tS) and the hold time (tH) are sufficiently ensured in the DRAM device 60. FIG. 8 is a timing diagram when the frequency of the external clock signal WCLK is 500 MHz (period is 2000 ps). It is understood that based on the operation, the set-up time (tS) and the hold time (tH) are also sufficiently ensured when the frequency of the external clock signal WCLK is 200 MHz (period is 5000 ps). According to the fourth embodiment, the necessary number of clocks from the rising edge of the external clock signal WCLK for fetching the C/A signal to the register 40c to a using timing of the C/A signal in the DRAM device 60 (namely, additional latency) is suppressed to 3.0 (refer to WCLK@Reg and CA@DRAM-avg in FIG. 8).

According to the fourth embodiment, the delay FF (D-FF) as the flip-flop is shown as an example. However, as noted in the first to third embodiments, if the connection relationship of the delay FF is changed as follows, the operation is the same as that mentioned above. That is, the data output terminals Q of the first to fourth pre-processing flip-flops FF1a and FF1d are connected to the data input terminals D of the first to fourth post-processing flip-flops FF2a to FF2d. In this case, the first to fourth post-processing flip-flops FF2a to FF2d latch the inverse signals of the first to fourth intermediate C/A signals CA'-a, CA'-b, CA'-c and CA'-d. Therefore, output signals of the data output terminals Q of the first to fourth post-processing flip-flops FF2a to FF2d are the inverse signals of the fifth to eighth intermediate C/A signals CA-a, CA-b, CA-c, and CA-d. In place thereof, output signals of the data inverse output terminals Q_b of the first to fourth post-processing flip-flops FF2a and FF2d become the same signals as the fifth to eighth intermediate C/A signals CA-a, CA-b, CA-c, and CA-d and, therefore, they are inputted to the selector 412. The above-mentioned change of the connection relationship essentially does not change the operation according to the fourth embodiment of the present invention, and it is included in the concept of the present invention. Another flip-flop can be used in place of the delay FF according to the fourth embodiment without departing the concept of the present invention.

As mentioned above, in the present invention, the register uses the structure in which the C/A signal as a latched signal is temporarily latched by the external clock signal and thereafter, the latched output is further latched by the internal clock signal. Thus, as long as the operating frequency is constant, the set-up time and the hold time can sufficiently be ensured for the latch operation in the register irrespective of the number of mounted memory devices. In the present invention, further, the C/A signal is decompressed so as to temporarily have a period of $n^2$ times and the decompressed data are latched by the internal clock signal in the register. Thus, the set-up time and the hold time can sufficiently be ensured for the latch operation in the register irrespective of the number of mounted memory devices and the frequency level. The above-mentioned advantages are remarkable, in particular, when the operating frequency band is 200 MHz or more. When the C/A signal temporarily has a period of two times in the register, the above-mentioned advantages can be accomplished with the relatively simple structure.

What is claimed is:

1. A register mounted on a memory module including a plurality of memory devices, said register receiving an external clock signal and a command/address signal indicated by a plurality of continuous values from a chip set outside the memory module and generating an internal command/address signal for said plurality of memory devices, said register comprising:
   a delay locked loop circuit receiving said external clock signal, adjusting the amount of delay, and generating an internal clock signal;
   first latching means for latching said command/address signal in accordance with said external clock signal and generating a first intermediate command/address signal;
   second latching means for latching said first intermediate command/address signal in accordance with said internal clock signal and generating a second intermediate command/address signal; and
   output means for outputting said internal command/address signal in accordance with said second intermediate command/address signal.

2. A register according to claim 1, wherein a frequency of said external clock signal is not less than 200 MHz and is not more than 600 MHz.

3. A register mounted on a memory module including a plurality of memory devices, said register receiving an external clock signal and a command/address signal indicated by a plurality of continuous values from a chip set outside the memory module and generating an internal command/address signal for said plurality of memory devices, said register comprising:
   a delay locked loop circuit for receiving said external clock signal, adjusting the amount of delay, and generating an internal clock signal;
   rate converting means receiving said command/address signal and generating first and second intermediate command/address signals having a half frequency of said command/address signal, said first intermediate command/address signal having one of odd-th and even-th command/address signals, said second intermediate command/address signal having the other of the odd-th and even-th command/address signals;
   latching means for latching said first and second intermediate command/address signals in accordance with said internal clock signal and generating third and fourth intermediate command/address signals; and
   output means for alternately selecting said third and fourth intermediate command/address signals by a half frequency of said internal clock signal and outputting said internal command/address signal.

4. A register according to claim 3, wherein a frequency of said external clock signal is not less than 200 MHz and is not more than 600 MHz.

5. A register according to claim 3, wherein a phase difference between said first intermediate command/address signal and said second intermediate command/address signal is a period of said external clock signal.

6. A register according to claim 3, wherein said rate converting means comprises:
   a ½ divider for dividing a frequency of said external clock signal into two frequencies and generating a first temporary external clock signal having a frequency that is half the frequency of said external clock signal;
   an additional delay locked loop circuit connected to said ½ divider, for controlling the delay of said ½ divider relative to said first temporary external clock signal and generating a second temporary external clock signal;
   a first pre-processing flip-flop connected to said additional delay locked loop circuit, for latching said command/address signal in accordance with said second temporary external clock signal and generating said first intermediate command/address signal; and
   a second pre-processing flip-flop connected to said additional delay locked loop circuit, for latching said command/address signal in accordance with an inverse signal of said second temporary external clock signal and generating said second intermediate command/address signal.

7. A register according to claim 6, wherein said latching means comprises:
   a first post-processing flip-flop connected to said delay locked loop circuit and said first pre-processing flip-flop, for latching said first intermediate command/address signal in accordance with said internal clock signal and outputting said third intermediate command/address signal; and
   a second post-processing flip-flop connected to said delay locked loop circuit and said second pre-processing flip-flop, for latching said second intermediate command/address signal in accordance with said internal clock signal and outputting said fourth intermediate command/address signal.

8. A register according to claim 7, wherein said output means comprises:
   an additional ½ divider for dividing a frequency of said internal clock signal into two frequencies and generating a temporary internal clock signal having a frequency that is half the frequency of said internal clock signal;
   a selector connected to said additional ½ divider and said first and second post-processing flip-flops, for alternately selecting said third and fourth intermediate command/address signals in accordance with said temporary internal clock signal and outputting a selected command/address signal; and
   a drive for generating said internal command/address signal in accordance with said selected command/address signal.

9. A register according to claim 3, wherein said rate converting means comprises:
   a ½ divider for dividing a frequency of said external clock signal into two frequencies and generating a temporary external clock signal having a frequency that is half the frequency of said external clock signal;
   a first pre-processing flip-flop connected to said ½ divider, for latching said command/address signal in accordance with said temporary external clock signal and generating said first intermediate command/address signal; and a second pre-processing flip-flop connected to said ½ divider, for latching said command/address signal in accordance with an inverse signal of said temporary external clock signal and generating said second intermediate command/address signal.

10. A register according to claim 9, wherein said latching means comprises:

a first post-processing flip-flop connected to said delay locked loop circuit and said first pre-processing flip-flop, for latching said first intermediate command/address signal in accordance with said internal clock signal and outputting said third intermediate command/address signal; and a second post-processing flip-flop connected to said delay locked loop circuit and said second pre-processing flip-flop, for latching said second intermediate command/address signal in accordance with said internal clock signal and outputting said fourth intermediate command/address signal.

11. A register according to claim 10, wherein said output means comprises:

an additional ½ divider for dividing a frequency of said internal clock signal into two frequencies and generating a temporary internal clock signal having a frequency that is half the frequency of said internal clock signal;

a selector connected to said additional ½ divider and said first and second post-processing flip-flops, for alternately selecting said third and fourth intermediate command/address signals in accordance with said temporary internal clock signal and outputting a selected command/address signal; and a drive for generating said internal command/address signal in accordance with said selected command/address signal.

12. A register according to claim 3, further comprising:

external clock adjusting means for generating an external clock signal adjusted by using a cross point between said external clock signal and an inverse signal of said external clock signal and for supplying said adjusted external clock signal as said external clock signal to said delay locked loop circuit and said rate converting means.

13. A register mounted on a memory module including a plurality of memory devices, said register receiving an external clock signal and a command/address signal indicated by a plurality of continuous values from a chip set outside the memory module and generating an internal command/address signal for said plurality of memory devices, said register comprising:

a delay locked loop circuit receiving said external clock signal, adjusting the amount of delay, and generating an internal clock signal;

rate converting means receiving said command/address signal and generating first to n-th intermediate command/address signals having a frequency of $1/n^2$ (where n is a natural number and is not less than 2) of said command/address signal, said first to n-th intermediate command/address signals having values that are sequentially selected at intervals of (n−1) values from among the plurality of continuous values of said command/address signal;

latching means for latching said first to n-th intermediate command/address signals in accordance with said internal clock signal and generating (n+1)-th to 2n-th intermediate command/address signals; and output means for sequentially selecting said (n+1)-th to 2n-th intermediate command/address signals by a frequency of $1/n^2$ of said internal clock signal and outputting said internal command/address signal.

14. A register according to claim 13, wherein a frequency of said external clock signal is not less than 200 MHz and is not more than 600 MHz.

15. A memory module comprising:

i) a plurality of memory devices; and ii) a register, said register receiving an external clock signal and a command/address signal indicated by a plurality of continuous values from a chip set outside the memory module and generating an internal command/address signal for said plurality of memory devices, said register comprising:

a) a delay locked loop circuit receiving said external clock signal, adjusting the amount of delay, and generating an internal clock signal;

b) first latching means for latching said command/address signal in accordance with said external clock signal and generating a first intermediate command/address signal;

c) second latching means for latching said first intermediate command/address signal in accordance with said internal clock signal and generating a second intermediate command/address signal; and d) output means for outputting said internal command/address signal in accordance with said second intermediate command/address signal;

wherein said register and said plurality of memory devices are mounted on a single substrate.

16. A memory module according to claim 15, wherein the number of said plurality of memory devices is not less than 4 and is not more than 18.

17. A memory system comprising:

A) a chip set; and

B) a memory module comprising:

i) a plurality of memory devices; and ii) a register, said register receiving an external clock signal and a command/address signal indicated by a plurality of continuous values from said chip set outside the memory module and generating an internal command/address signal for said plurality of memory devices, said register comprising:

a) a delay locked loop circuit receiving said external clock signal, adjusting the amount of delay, and generating an internal clock signal;

b) first latching means for latching said command/address signal in accordance with said external clock signal and generating a first intermediate command/address signal;

c) second latching means for latching said first intermediate command/address signal in accordance with said internal clock signal and generating a second intermediate command/address signal; and d) output means for outputting said internal command/address signal in accordance with said second intermediate command/address signal;

wherein said register and said plurality of memory devices are mounted on a single substrate.

18. A memory module comprising:

i) a plurality of memory devices; and ii) a register, said register receiving an external clock signal and a command/address signal indicated by a plurality of continuous values from a chip set outside the memory module and generating an internal command/address signal for said plurality of memory devices, said register comprising:
 a) a delay locked loop circuit for receiving said external clock signal, adjusting the amount of delay, and generating an internal clock signal;
 b) rate converting means receiving said command/address signal and generating first and second intermediate command/address signals having a half frequency of said command/address signal, said first intermediate command/address signal having one of odd-th and even-th command/address signals, said second intermediate command/address signal having the other of the odd-th and even-th command/address signals;
 c) latching means for latching said first and second intermediate command/address signals in accordance with said internal clock signal and generating third and fourth intermediate command/address signals; and
 d) output means for alternately selecting said third and fourth intermediate command/address signals by a half frequency of said internal clock signal and outputting said internal command/address signal;

wherein said register and said plurality of memory devices are mounted on a single substrate.

19. A memory module according to claim 18, wherein the number of said plurality of memory devices is not less than 4 and is not more than 18.

20. A memory system comprising:
 A) a chip set; and
 B) a memory module comprising:
  i) a plurality of memory devices; and
  ii) a register, said register receiving an external clock signal and a command/address signal indicated by a plurality of continuous values from said chip set outside the memory module and generating an internal command/address signal for said plurality of memory devices, said register comprising:
   a) a delay locked loop circuit for receiving said external clock signal, adjusting the amount of delay, and generating an internal clock signal;
   b) rate converting means receiving said command/address signal and generating first and second intermediate command/address signals having a half frequeny of said command/address signal, said first intermediate command/address signal having one of odd-th and even-th command/address signals, said second intermediate command/address signal having the other of the odd-th and even-th command/address signals;
   c) latching means for latching said first and second intermediate command/address signals in accordance with said internal clock signal and generating third and fourth intermediate command/address signals; and
   d) output means for alternately selecting said third and fourth intermediate command/address signals by a half frequency of said internal clock signal and outputting said internal command/address signal;

wherein said register and said plurality of memory devices are mounted on a single substrate.

21. A memory module comprising:
 i) a plurality of memory devices; and
 ii) a register, said register receiving an external clock signal and a command/address signal indicated by a plurality of continuous values from a chip set outside the memory module and generating an internal command/address signal for said plurality of memory devices, said register comprising:
  a) a delay locked loop circuit receiving said external clock signal, adjusting the amount of delay, and generating an internal clock signal;
  b) rate converting means receiving said command/address signal and generating first to n-th intermediate command/address signals having a frequency of $1/n^2$ (where n is a natural number and is not less than 2) of said command/address signal, said first to n-th intermediate command/address signals having values that are sequentially selected at intervals of (n−1) values from among the plurality of continuous values of said command/address signal;
  c) latching means for latching said first to n-th intermediate command/address signals in accordance with said internal clock signal and generating (n+1)-th to 2n-th intermediate command/address signals; and
  d) out-put means for sequentially selecting said (n+1)-th to 2n-th intermediate command/address signals by a frequency of $1/n^2$ of said internal clock signal and outputting said internal command/address signal;

wherein said register and said plurality of memory devices are mounted on a single substrate.

22. A memory module according to claim 21, wherein the number of said plurality of memory devices is not less than 4 and is not more than 18.

23. A memory system comprising:
 A) a chip set; and
 B) a memory module comprising:
  i) a plurality of memory devices; and
  ii) a register, said register receiving an external clock signal and a command/address signal indicated by a plurality of continuous values from said chip set outside the memory module and generating an internal command/address signal for said plurality of memory devices, said register comprising:
   a) a delay locked loop circuit receiving said external clock signal, adjusting the amount of delay, and generating an internal clock signal;
   b) rate converting means receiving said command/address signal and generating first to n-th intermediate command/address signals having a frequency of $1/n^2$ (where n is a natural number and is not less than 2) of said command/address signal, said first to n-th intermediate command/address signals having values that are sequentially selected at intervals of (n−1) values from among the plurality of continuous values of said command/address signal;
   c) latching means for latching said first to n-th intermediate command/address signals in accordance with said internal clock signal and generating a (n+1)-th to 2n-th intermediate command/address signals; and
   d) output means for sequentially selecting said (n+1)-th to 2n-th intermediate command/address signals by a frequency of $1/n^2$ of said internal clock signal and outputting said internal command/address signal;

wherein said register and said plurality of memory devices are mounted on a single substrate.

24. A memory system comprising a register mounted on a memory module including a plurality of memory devices, said register receiving an external clock signal and a command/address signal indicated by a plurality of continuous values from a chip set outside the memory module and generating an internal command/address signal for said plurality of memory devices, wherein said register comprises a delay locked loop circuit receiving said external clock signal, adjusting the amount of delay, and generating an internal clock signal, and wherein the necessary number of external clocks from a rising edge of the external clock signal for fetching the command/address signal to said register to a time for fetching the internal command/address signal corresponding to the command/address signal into said plurality of memory devices by the external clock signal is at least 2.0.

25. A register mounted on a memory module, said register comprising:

a first latching circuit for latching a command/address signal introduced from the outside of said memory module in accordance with a first clock signal and outputting a latch output as a first internal command/address signal; and a second latching circuit for latching said first internal command/address signal in accordance with a second clock signal and outputting a latch output as a second internal command/address signal;

wherein said first clock signal is an external clock signal introduced from the outside of said memory module and said second clock signal is an internal clock signal which is generated based on said external clock signal.

26. A register according to claim 25, further comprising:

a delay locked loop circuit for generating said internal clock signal based on said external clock signal.

* * * * *